(12) United States Patent
Guo et al.

(10) Patent No.: US 9,281,493 B2
(45) Date of Patent: Mar. 8, 2016

(54) FLEXIBLE SUBSTRATE AND MANUFACTURING METHOD THEREOF, OLED DISPLAY DEVICE

(71) Applicants: HEFEI BOE OPTOELECTRONICS TECHNOLOGY CO., LTD., Hefei, Anhui (CN); BOE TECHNOLOGY GROUP CO., LTD., Beijing (CN)

(72) Inventors: Yuanhui Guo, Beijing (CN); Hui Wang, Beijing (CN); Chun Wang, Beijing (CN); Yisan Zhang, Beijing (CN)

(73) Assignees: HEFEI BOE OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/344,202

(22) PCT Filed: Aug. 26, 2013

(86) PCT No.: PCT/CN2013/082311
§ 371 (c)(1),
(2) Date: Mar. 11, 2014

(87) PCT Pub. No.: WO2014/180077
PCT Pub. Date: Nov. 13, 2014

(65) Prior Publication Data
US 2015/0171363 A1    Jun. 18, 2015

(30) Foreign Application Priority Data

May 10, 2013 (CN) .......................... 2013 1 0172698

(51) Int. Cl.
*H01L 51/52* (2006.01)
*H01L 51/00* (2006.01)
*H01L 51/56* (2006.01)

(52) U.S. Cl.
CPC ........ *H01L 51/5206* (2013.01); *H01L 51/0097* (2013.01); *H01L 51/5212* (2013.01);
(Continued)

(58) Field of Classification Search
CPC . H01L 51/5206; H01L 51/0097; H01L 51/56; H01L 51/0037
See application file for complete search history.

(56) References Cited

U.S. PATENT DOCUMENTS

2006/0061270 A1    3/2006  Uhlig et al.
2008/0314626 A1   12/2008  Moore
(Continued)

FOREIGN PATENT DOCUMENTS

CN     1790770 A1    6/2006
CN   101228568 A     7/2008
(Continued)

OTHER PUBLICATIONS

Third Chinese Office Action Appln. No. 201310172698.0; Dated Jan. 20, 2015.
(Continued)

*Primary Examiner* — Mamadou Diallo
(74) *Attorney, Agent, or Firm* — Ladas & Parry LLP

(57) ABSTRACT

A flexible substrate, a manufacturing method for the flexible substrate and an OLED display device including the flexible substrate are provided. The flexible substrate includes a flexible base on which a mesh depression layer is provided, in which a mesh current sinking layer is embedded. The mesh current sinking layer is configured to enhance electrical conductivity of the flexible substrate. With the mesh depression layer, the mesh current sinking layer may be embedded in the flexible substrate, which effectively enhances the electrical conductivity of the flexible substrate.

12 Claims, 4 Drawing Sheets

(52) U.S. Cl.
CPC ............. *H01L51/56* (2013.01); *H01L 51/0036* (2013.01); *H01L 51/0037* (2013.01); *H01L 2251/5338* (2013.01); *Y10T 428/24612* (2015.01)

(56) References Cited

U.S. PATENT DOCUMENTS

| | | |
|---|---|---|
| 2009/0080099 A1 | 3/2009 | Tanimoto et al. |
| 2009/0166877 A1 | 7/2009 | Lifka et al. |
| 2012/0211739 A1 | 8/2012 | Koyama et al. |
| 2013/0157446 A1 | 6/2013 | Lifka et al. |
| 2014/0167006 A1* | 6/2014 | Kim ............................ 257/40 |
| 2014/0175443 A1 | 6/2014 | Xie |

FOREIGN PATENT DOCUMENTS

| | | |
|---|---|---|
| CN | 101427377 A | 5/2009 |
| CN | 101615594 A | 12/2009 |
| CN | 102063951 A | 5/2011 |
| CN | 103035568 A | 4/2013 |
| CN | 103098255 A | 5/2013 |
| CN | 103236504 A | 8/2013 |
| CN | 203218338 U | 9/2013 |
| JP | 2006-093123 A | 4/2006 |
| KR | 102011016641 A | 3/2012 |
| WO | 2012032446 A1 | 3/2012 |

OTHER PUBLICATIONS

Korean Office Action Appln. No. 10-2014-7005599; Dated Jan. 20, 2015.
International Search Report mailed Jun. 2, 2014; PCT/CN2013/082311.
First Chinese Office Action dated Feb. 20, 2014; Appln. No. 20130172698.0.
Second Chinese Office Action Appln. No. 201310172698.0; Dated Oct. 10, 2014.
International Search Report dated Dec. 30, 2013; PCT/CN2013/077319.
First Chinese Office Action dated Jul. 3, 2014; Appln. No. 20130145991.8.
Fourth Chinese Office Action Appln. No. 201310172698.0; Dated Jun. 11, 2015.
Korean examination Opinion Appln. No. 10-2014-7005599; Dated Jul. 21, 2015.
Korean Office action dated Aug. 28, 2015; Appln. No. 10-2014-7005599.
Fifth Chinese Office Action dated Oct. 27, 2015; Appln. No. 201310172698.0.
International Preliminary Report on Patentability issued Nov. 10, 2015; PCT/GN2013/082311.

* cited by examiner

US 9,281,493 B2

FLEXIBLE SUBSTRATE AND MANUFACTURING METHOD THEREOF, OLED DISPLAY DEVICE

TECHNICAL FIELD

Embodiments of the present invention relate to a flexible substrate, a manufacturing method of the flexible substrate, and an OLED display device including the flexible substrate.

BACKGROUND

Up to now, display devices that have been practically applied mainly include cathode ray tubes (CRTs), liquid crystal displays (LCDs), vacuum fluorescent devices (VFDs), plasma displays (PDPs), organic light emitting diodes (OLEDs), field emitting displays (FEDs), and electroluminescent displays (ELDs).

An OLED (organic light-emitting diode) display device includes an anode, an organic light emitting layer and a cathode. Compared with an LCD display device, an OLED display device has advantages such as small thickness, light weight, wide viewing angle, active light emission, continuously tunable emission color, low costs, fast response speed, small energy dissipation, low driving voltage, wide operating temperature range, simple production process, high luminous efficiency, and flexible display. OLEDs have gained great attention from the industrial community and scientific community due to their advantages and promising application prospects un-comparable to other kinds of displays.

When manufacturing an OLED display, since the cathode is typically of a low work function metal, the anode needs high work function material to match with it. At present, commonly used anode materials are conductive polymer materials. However, electrical conductivities of polymer materials are poor compared with metal and indium tin oxide (ITO) materials.

SUMMARY

Embodiments of the present invention provide a flexible substrate and a manufacturing method thereof, and an OLED display device, in which the flexible substrate embeds therein a mesh current sinking layer with a mesh depression layer to enhance the electrical conductivity of the flexible substrate.

One aspect of the present invention provides a flexible substrate comprising a flexible base that is provided with a mesh depression layer in which a mesh current sinking layer is embedded.

For example, in the flexible substrate, a top surface of the mesh current sinking layer may be flush with an upper surface of the flexible substrate.

For example, the flexible substrate may be an OLED flexible substrate.

For example, in the flexible substrate, the mesh depression layer may exhibit a mesh configuration with rectangular openings.

For example, in the flexible substrate, the mesh current sinking layer may be made of a metal material.

For example, in the flexible substrate, the flexible substrate may be made of a photosensitive polymer material.

For example, in the flexible substrate, a thickness of the mesh current sinking layer may be 5-30 nm.

Another aspect of the present invention provides a manufacturing method for any of the above-mentioned flexible substrates, including: providing a current sinking film layer on a film foaming substrate; manufacturing the current sinking film layer into a mesh current sinking layer; providing a flexible base material on the mesh current sinking layer; curing the substrate formed with the flexible base material; and removing the film forming substrate to form the flexible substrate.

For example, in the method, the current sinking film layer base material may be manufactured into the mesh current sinking layer with a patterning process.

Yet another aspect of the present invention provides an OLED display device including an anode and any of the above-mentioned flexible substrates, and the anode is disposed on the flexible substrate.

For example, in the display device, the anode material may be one of poly(3,4-ethylenedioxythiophene) and poly(3,4-ethylenedioxythiophene)-poly(styrenesulfonate) or a mixture of them.

For example, in the display device, the display device may further include an organic light emitting layer and a cathode.

For example, in the display device, the organic light emitting layer may be disposed on the anode and the cathode may be disposed on the organic light emitting layer.

BRIEF DESCRIPTION OF THE DRAWINGS

For better understanding technical proposals according to embodiments of the present invention, drawings of the embodiments will be described briefly below. Obviously, drawings in the following description only relate to some embodiments of the present invention, not to limit the present invention.

DETAILED DESCRIPTION

In order to make the purpose, technology solution and advantages of embodiments of the present invention more clear, technology solutions according to embodiments of the present invention will be described clearly and completely below with respect to drawings of embodiments of the present invention. It is to be understood that the following described embodiments are part of but not all of embodiments of the present invention. Based on the described embodiments of the present invention, all other embodiments obtained by those of ordinary skill in the art without any creative labor fall into the protecting scope of the present invention.

Figure 1:
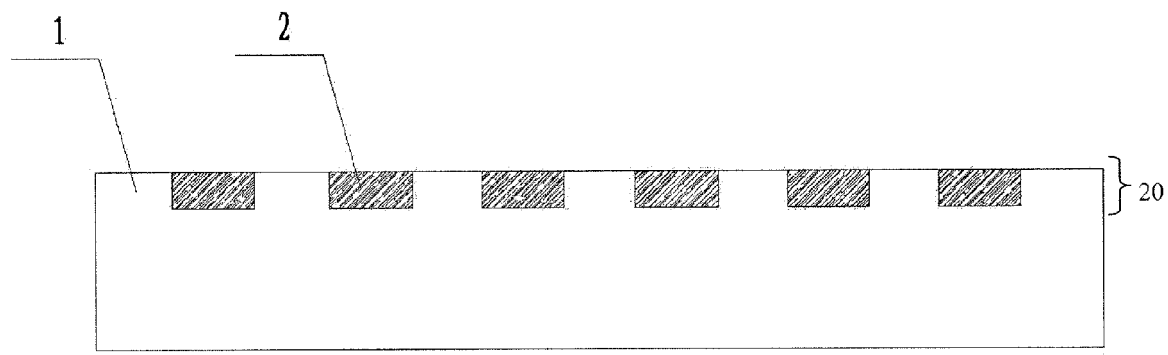
FIG. 1 is a structural representation (front view) of a flexible substrate in the present invention.
Figure 2:
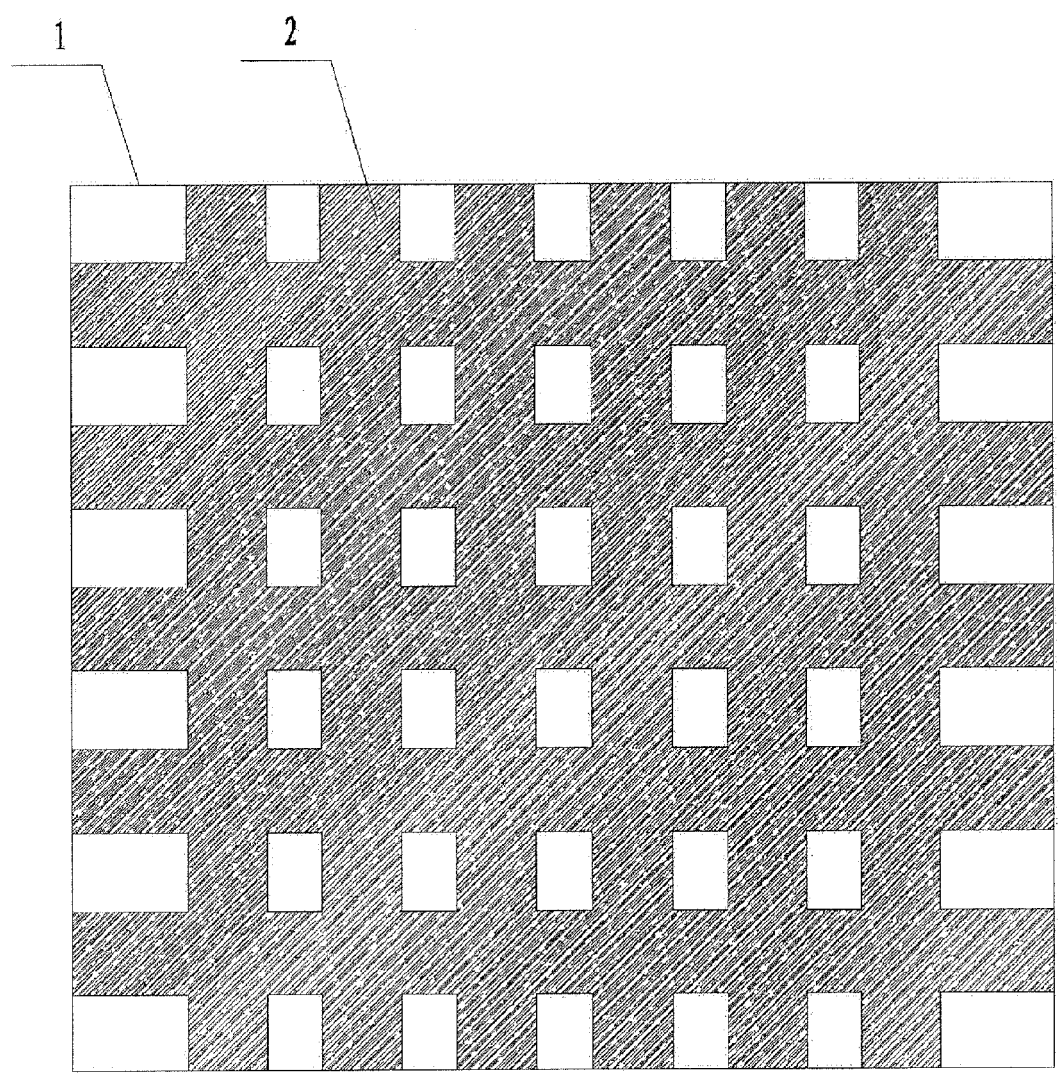
FIG. 2 is a structural representation (top view) of a flexible substrate in the present invention.

Referring to FIGS. 1 and 2, the flexible substrate according to an embodiment of the present invention includes a flexible base 1 provided with a mesh depression layer 20 thereon in which a mesh current sinking layer 2 is embedded. The mesh current sinking layer 2 can enhance electrical conductivity of the flexible substrate. The mesh current sinking layer 2 in this embodiment may be a thin-film-like mesh layer made of a metallic material with good electrical conductivity such as silver and copper; and this metal material is preferably silver. In this embodiment, the flexible substrate is for example an OLED flexible substrate, namely a flexible substrate adapted for OLED.

A mesh current sinking layer may be embedded in the mesh depression layer of the flexible substrate according to an embodiment of the present invention to make the mesh current sinking layer entirely provided in the mesh depression layer, which effectively enhances electrical conductivity of the flexible substrate. If this substrate is applied in an OLED display device, the electrical conductivity of the anode in the OLED display device can be enhanced.

For example, the top surface of the mesh current sinking layer in this embodiment is flush with the upper surface of the flexible substrate to make the mesh current sinking layer sufficiently contact the anode provided thereon, thereby allowing the mesh current sinking layer to sufficiently enhance the electrical conductivity of anode. The mesh depression layer in this embodiment may include a plurality of channels (grooves) disposed in an intersecting configuration which may communicate with each other.

In this embodiment, the mesh depression layer may exhibit a mesh configuration with an arbitrary shape, for example a mesh with circular mesh openings, and the mesh current sinking layer embedded therein takes this shape accordingly. In this embodiment, the mesh depression layer may also exhibit a mesh configuration with rectangular openings, and the mesh current sinking layer embedded therein exhibits a mesh configuration with rectangular openings accordingly. A mesh with rectangular openings refers to a mesh structure with mesh openings that exhibit rectangular shape. In this embodiment, the mesh depression layer may also exhibit a mesh configuration with circular ring openings, and accordingly the mesh current sinking layer embedded therein also exhibit a mesh configuration with circular ring openings. In this embodiment, the mesh depression layer may also exhibit a mesh configuration with regular polygon openings, in which a mesh with regular polygon openings refers to a mesh structure with regular polygon openings, and the mesh current sinking layer embedded therein exhibits a mesh configuration with regular polygon openings accordingly. Referring to FIG. 2, the shown embodiment adopts a mesh structure with rectangular openings in consideration of saving design and manufacturing costs.

In this embodiment, the flexible substrate may be made of a photosensitive polymer material. The photosensitive polymer material used by the flexible substrate in an embodiment of the present invention includes a material such as styrene series, acrylics series, acrylate series, epoxy series, unsaturated polyester series, amide series or vinyl acetate series. For example, each of the above-mentioned materials may include monomer, prepolymer and photoinitiator; and the polymerization process type for the above-mentioned materials may be free radical, anionic or cationic.

In this embodiment, the mesh current sinking layer is a translucent film like mesh layer made of a silver metal with a thickness of 5-30 nm, preferably 10 nm-20 nm. In order to guarantee that the top surface of the mesh current sinking layer is flush with the upper surface of the flexible substrate, the thickness of the mesh depression layer is also selected accordingly between 5-30 nm as the thickness of the mesh current sinking layer. With a thickness of 10 nm-20 nm, it is possible to both guarantee the electrical conductivity of the current sinking layer, and guarantee the light transmittance of the current sinking layer, without causing a too low light transmittance due to an excessive thickness. Furthermore, in manufacturing devices such as OLED devices with this flexible substrate later, the transmittance of the overall device will not be impacted.

An embodiment of the present invention further provides a manufacturing method for the flexible substrate described above including the following steps.

Figure 3:
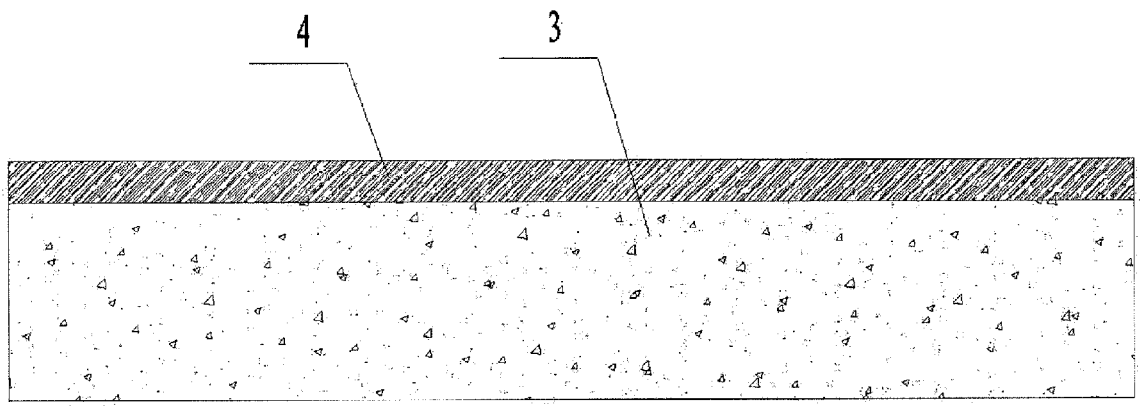
FIG. 3 is a step schematic diagram (front sectional view) of a manufacturing method of the flexible substrate in the present invention.

Referring to FIG. 3, a current sinking film layer 4 is disposed on a film forming substrate 3. In this embodiment, the film forming substrate 3 may be a planar substrate that is made of a silicon material, provided with a silicon dioxide insulating layer and cleaned. Of course, it is also possible to select other materials for manufacturing the planar substrate according to specific circumstances, such as a glass material and polyvinyl chloride. The current sinking film layer in this embodiment may be deposited on the film forming substrate by evaporation process, which may be a metal thin film made of a metallic material with good electrical conductivity such as silver and copper; and this metal material is preferably silver.

Figure 4:
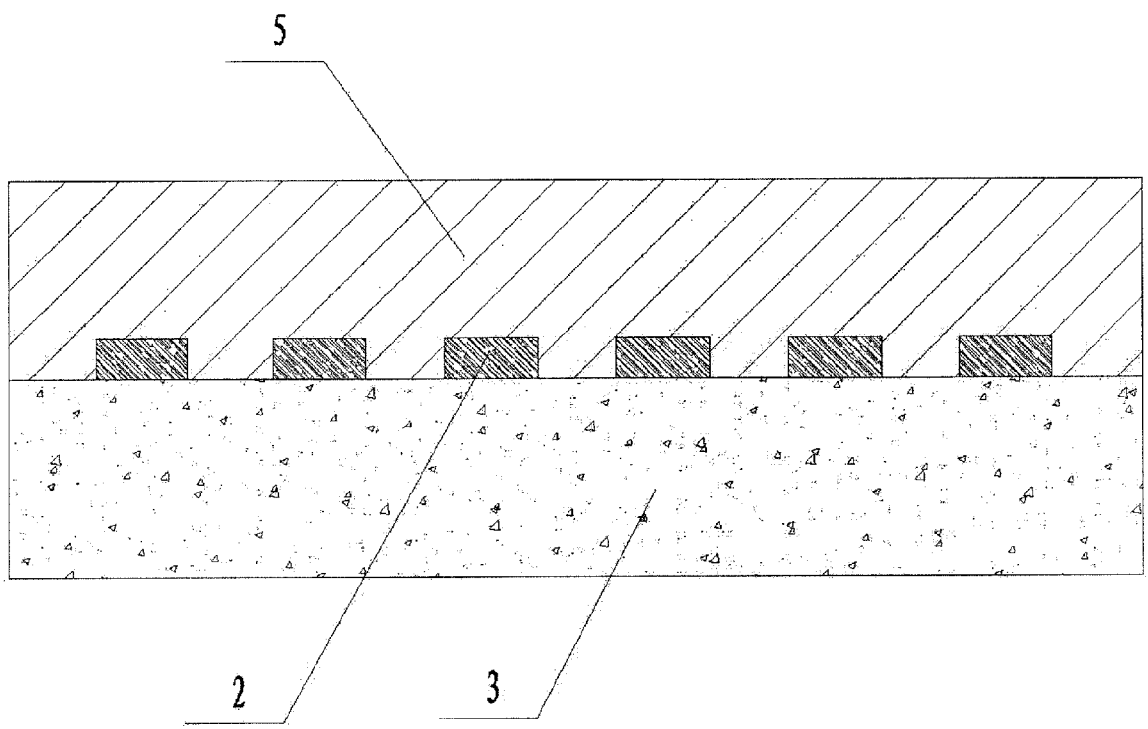
FIG. 4 is a step schematic diagram (front sectional view) of a manufacturing method of the flexible substrate in the present invention.

Referring to FIG. 4, the current sinking film layer is fabricated as a mesh current sinking layer by a patterning process according to design requirements of the mesh current sinking layer. The patterning process generally includes steps of photoresist coating, exposure, developing, etching, photoresist removal and so on. When fabricating the mesh current sinking layer, if evaporation is used, it is also possible to use a mask to shield a portion of the area of the substrate in evaporation directly so as to deposit mesh current sinking layer on the substrate directly. With this step, steps of exposure, development, and etching can be omitted to simplify the process for manufacturing mesh current sinking layer and reduce costs.

Figure 5:
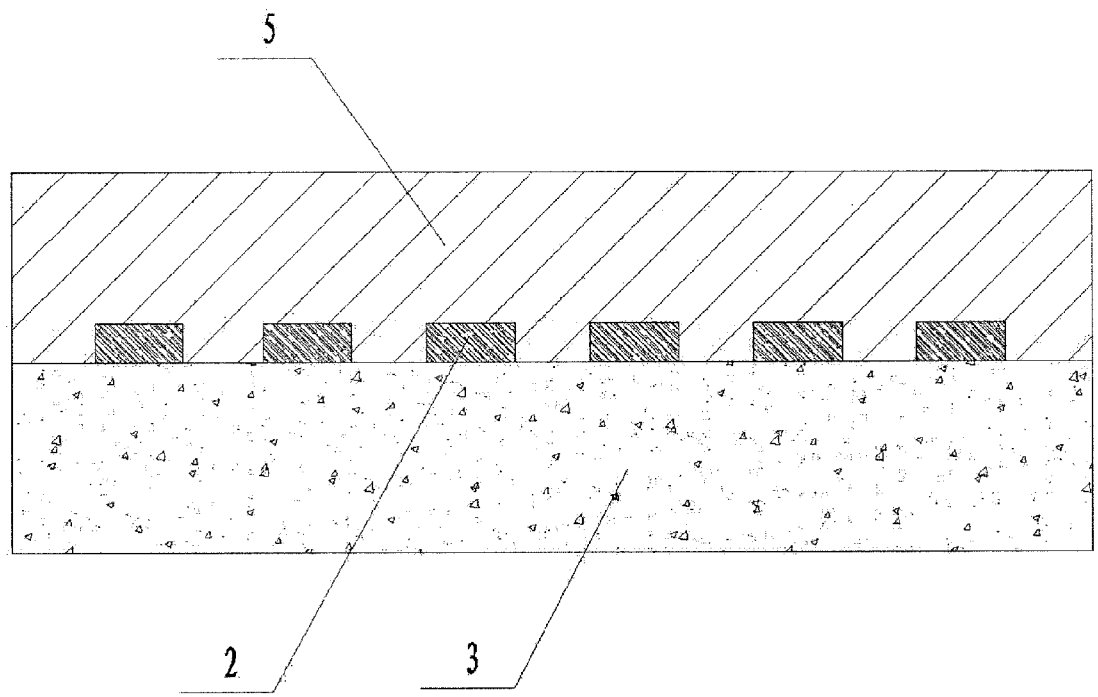
FIG. 5 is a step schematic diagram (front sectional view) of a manufacturing method of the flexible substrate in the present invention.

Referring to FIG. 5, on one side of the film forming substrate on which the mesh current sinking layer is provided, a flexible base material 5 is coated by means of spin coating, so as to form a substrate formed with the flexible base material. In this embodiment, the substrate formed with the flexible base material 5 includes a film forming substrate, the mesh current sinking layer disposed on the film forming substrate, and a flexible base material cladding over the mesh current sinking layer. At this time, the mesh current sinking layer is wholly embedded into a lower end surface of the flexible base material that faces an upper end surface of the film forming substrate and thereby forms a mesh depression layer adaptable to the mesh current sinking layer on the lower end surface of the flexible base material. In this embodiment, the flexible base material may be a photosensitive polymer material. The photosensitive polymer material may be styrene series, acrylic acid series, acrylate series, epoxy series, unsaturated polyester series, amide series or vinyl acetate series. Each of the above-mentioned material includes a monomer, a prepolymer and a photoinitiator. The polymerization process type for the above-mentioned materials may be of free radical, anionic or cationic. In this embodiment, the thickness of the flexible base material may be 0.3-0.8 mm, preferably 0.5 mm-0.7 mm. The spin coating speed for the flexible base material may be 800-2000 rpm (round per minute), preferably 1000 rpm, and the spin coating time may be 10-30 s (second), preferably 20 s. Disposing a flexible base material on the film forming substrate by means of spin coating can improve uniformity of the flexible base material to enable it to clad over the mesh current sinking layer more sufficiently and at the same time make the connection between the mesh current sinking layer and the flexible base material more close, hence ensuring smooth releasing process thereafter.

For example, the substrate with the flexible base material is subjected to ultraviolet cure by means of ultraviolet cure equipment (such as any existing ultraviolet cure equipment) to cure the flexible base material and the mesh current sinking layer together to integrate with each other. In this embodiment, the ultraviolet cure time may be 2-5 min (minute), preferably 3 min.

The cured substrate with the flexible base material forms a flexible substrate consisted of the flexible base material provided with the mesh depression layer and the mesh current sinking layer which has a relatively stable structure.

Figure 6:
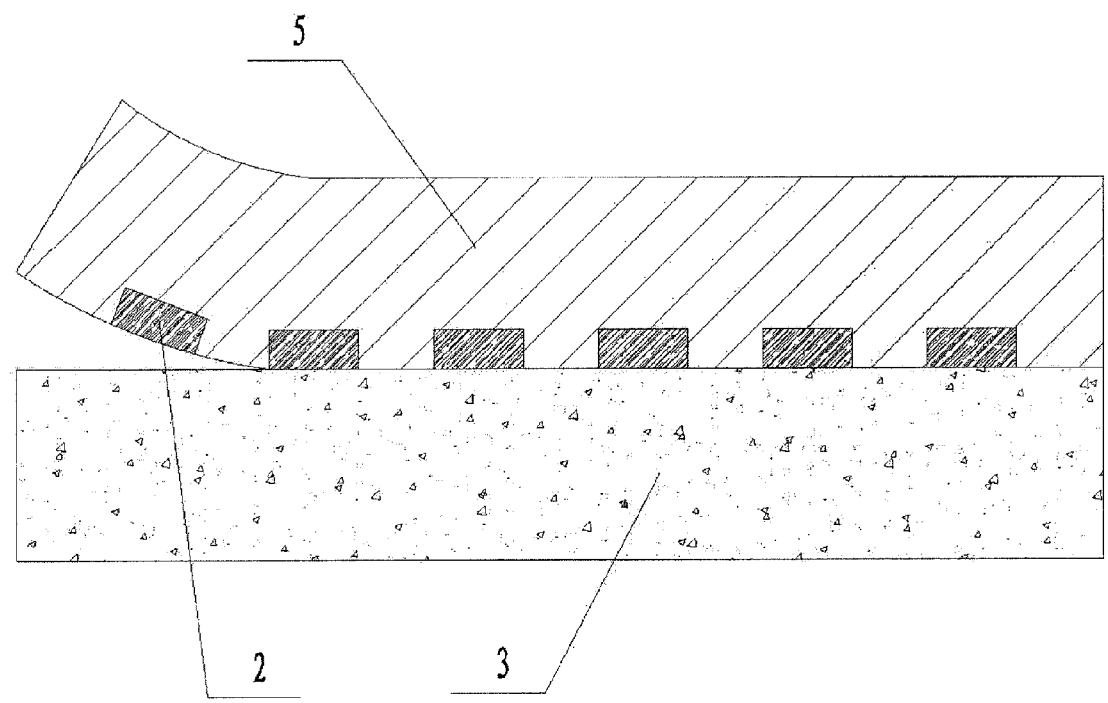
FIG. 6 is a step schematic diagram (front sectional view) of a manufacturing method of the flexible substrate in the present invention.

As shown in FIG. 6, the flexible substrate is subjected to releasing process. The film forming substrate is removed to form the flexible substrate. Releasing means the process of stripping the flexible substrate off the film forming substrate. Thereby a complete flexible substrate is manufactured here. The adhesivity between the mesh current sinking layer and the flexible base material is greater than that between the mesh current sinking layer and the film forming substrate; and therefore during the flexible substrate stripping process, the following case will not occur in which the mesh current sinking layer is stripped off the flexible base material since it's stuck with the film forming substrate.

Embodiments of the present invention adopt the step of curing the mesh current sinking layer into the flexible base material by ultraviolet light directly. With the fluid property of the flexible base material prior to curing, it can be allowed to combine with the mesh current sinking layer more sufficiently and naturally and the matching degree between them can become higher. The flexible substrate manufactured in this way has a smoother end surface on which the mesh current sinking layer is provided, which realizes a smoother anode surface coated thereon.

Figure 7:
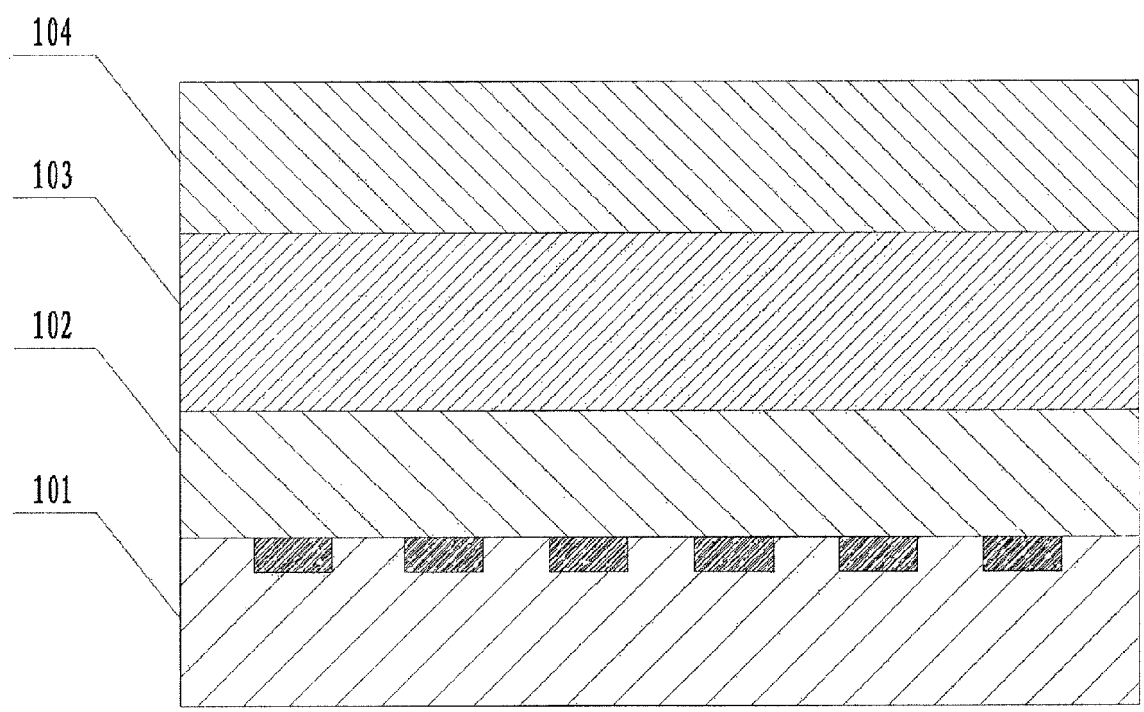
FIG. 7 is a structural representation (front sectional view) of the OLED display device in the present invention.

As shown in FIG. 7, an embodiment of the present invention further provides an OLED display device including an anode and any one of the flexible substrates 101 as mentioned above. The cathode is disposed on the organic illuminating layer. The anode 102, the organic light emitting layer 103, and the cathode 104 are provided in order from bottom to top on the flexible substrate. The anode is disposed on the flexible substrate; the organic light emitting layer is disposed on the anode, the cathode is disposed on the organic light emitting layer. Since a mesh current sinking layer is provided on the flexible substrate, the poor electrical conductivity of the anode may be addressed. Since an embedding structure is used and the top surface of the mesh current sinking layer is flush with the upper surface of the flexible substrate, it is possible to enhance smoothness of the flexible substrate and in turn enhance the smoothness of the anode on the flexible substrate. The smoothness of the anode surface directly influences the effect of carrier injection, and therefore the improvement of its smoothness will accordingly enhance the injection effect of carriers.

The anode material in an embodiment of the present invention may be one of poly(3,4-ethylenedioxythiophene) and poly(3,4-ethylenedioxythiophene)-poly(styrenesulfonate) or a mixture of them.

The OLED display device according to an embodiment of the present invention adopts the above-mentioned design of the flexible substrate. It possesses not only corresponding functions of the flexible substrate, but also reduces the thickness of an OLED display device since the flexible substrate embeds the mesh current sinking layer into the mesh depression layer, making it more esthetic, lighter and thinner.

An embodiment of the present invention further provides a manufacturing method for the above-mentioned OLED display device including the following steps.

An anode base material is coated on one side of the flexible substrate on which the mesh current sinking layer is provided. In this embodiment, the anode base material may be coated by means of spin coating. This kind of coating process can allow the anode base material and the mesh current sinking layer of the flexible substrate contact sufficiently and fix to each other, which effectively guarantees carrier transitivity between them. The thickness of the anode may be 20-60 nm, preferably 40 nm.

The cathode base material described in this embodiment is made of a metal film or a conductive high molecular material with good electrical conductivity. In this embodiment, the anode base material may be made of a conductive high molecular material PEDOT/PSS made from PEDOT (polymer from 3,4-ethylene dioxy-thiophene monomer) doped with PSS (water soluble polymer electrolyte polysuberamide).

For example, the flexible substrate provided with an anode may be subjected to a drying process with a vacuum oven. The drying temperature of the vacuum oven described in this embodiment may be 60-100° C., preferably 80° C., and the drying time duration may be 7-10 hours, preferably 8 hours. Selections of the drying temperature and drying duration described in this embodiment should be set depending on manufacture requirements of flexible substrates with different specifications.

After the drying process, an organic light emitting layer is coated on the anode. For example, the flexible substrate provided with the anode is transferred into a vacuum processing room for evaporation of an organic light emitting layer. The organic light emitting layer described in this embodiment may be made of a polymer material layer made by solving PVK (polyvinylcarbazole) molecules and PBD (2-(4-biphenylyl)-5-phenyloxadiazole) molecules by a chlorobenzene solution and doping with heavy metal iridium and a TPBI (1,3,5-tris(1-phenyl-1H-benzimidazol-2-yl)benzene) layer. The weight fraction ratio of PVK molecules, PBD molecules and iridium may be (60-80):(20-40):1. In this embodiment, the layer thickness of the polymer materials of the organic light emitting layer may be 60-80 nm, preferably 70 nm, and the TPBI layer thickness is 20-50 nm, preferably 30 nm.

In the vacuum state, a cathode base material is evaporated on the organic light emitting layer. In this embodiment, the vacuum state refers to a vacuum environment with less than $3 \times 10^{-4}$ Pa atmosphere. The cathode base material is provided on the organic light emitting layer by means of an evaporation process and thereby the cathode is completed. So far, the fabrication of OLED display device is completed.

Embodiments of the present invention may have one or all of the following advantages:

1. The mesh depression layer can be used to embed the mesh current sinking layer to provide the mesh current sinking layer entirely in the mesh depression layer, which effectively improves the electrical conductivity of the flexible substrate. If this flexible substrate is applied in an OLED display device, the poor electrical conductivity of the anode in the OLED display device can be addressed.

2. The top surface of the mesh current layer can be flush with the upper surface of the flexible substrate, which thereby improves the electrical conductivity of the flexible substrate and enhances smoothness of the flexible substrate at the same time. If this flexible substrate is applied in an OLED display device, the smoothness of the anode surface may be enhanced. The smoother the anode surface is, the powerful the surface's carrier injection capability is. Therefore, it is possible to enhance electrical conductivity of the anode.

3. If the mesh current sinking layer is directly cured into the flexible base material with ultraviolet light, with the fluid property of the flexible base material prior to curing, it can combine with the mesh current sinking layer more sufficiently and naturally and the matching degree between them can become higher. The flexible substrate manufactured in this way has a smoother end surface on which the mesh depression layer is provided, which realizes a smoother anode surface coated thereon.

4. The anode base material may be coated with spin coating which allows the anode base material and the mesh current sinking layer of the flexible substrate contact sufficiently and fix to each other, which effectively guarantees carrier transitivity between them.

The above is only exemplary implementations of the present invention, rather than for limiting protection scope of the present invention, which is defined by the appended claims.

The invention claimed is:

1. A manufacturing method for a flexible substrate comprising a flexible base, wherein the flexible base is provided with a mesh depression layer in which a mesh current sinking layer is embedded, the method comprises:
    providing a current sinking film layer on a film forming substrate;
    manufacturing the current sinking film layer into a mesh current sinking layer;
    providing a flexible base material on the mesh current sinking layer;
    curing the substrate formed with the flexible base material; and
    removing the film forming substrate to form the flexible substrate.

2. The manufacturing method for the flexible substrate of claim 1, wherein the current sinking film layer is fabricated into the mesh current sinking layer with a patterning process.

3. The manufacturing method of claim 1, wherein a top surface of the mesh current sinking layer is flush with an upper surface of the flexible substrate.

4. The manufacturing method of claim 1, wherein the flexible substrate is an OLED flexible substrate.

5. The manufacturing method of claim 1, wherein the mesh depression layer exhibits a mesh configuration with rectangular openings.

6. The manufacturing method of claim 1, wherein the mesh current sinking layer is made of a metal material.

7. The manufacturing method of claim 1. wherein the flexible substrate is made of a photosensitive polymer material.

8. The manufacturing method of claim 1, wherein a thickness of the mesh current sinking layer is 5-30 nm.

9. A manufacturing method for an OLED display device comprising an anode and a flexible substrate comprising a flexible base, wherein the flexible base is provided with a mesh depression layer in which a mesh current sinking layer is embedded, the anode being disposed on the flexible substrate, the method comprises:
    providing a current sinking film layer on a film substrate;
    manufacturing the current sinking film layer into a mesh current sinking layer;
    providing a flexible base material on the mesh current sinking layer;
    curing the substrate formed with the flexible base material; and
    removing the film forming substrate to form the flexible substrate.

10. The manufacturing method of claim 9, wherein the anode material is one of poly (3,4-ethylenedioxythiophene) and poly (3,4-ethylenedioxythiophene)-poly (styrenesulfonate) or a mixture of them.

11. The manufacturing method of claim 10, further comprising an organic light emitting layer and a cathode.

12. The manufacturing method claim 11, wherein the organic light emitting layer is disposed on the anode and the cathode is disposed on the organic light emitting layer.

* * * * *